United States Patent
Pearson

(10) Patent No.: US 8,848,371 B2
(45) Date of Patent: Sep. 30, 2014

(54) DIELECTROPHORETIC RESTRICTION TO PREVENT VAPOR BACKFLOW

(71) Applicant: Hamilton Sundstrand Corporation, Windsor Locks, CT (US)

(72) Inventor: Matthew Robert Pearson, Hartford, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 207 days.

(21) Appl. No.: 13/632,332

(22) Filed: Oct. 1, 2012

(65) Prior Publication Data

US 2014/0092558 A1    Apr. 3, 2014

(51) Int. Cl.
  *F04B 19/00* (2006.01)
  *H05K 7/20* (2006.01)
  *G06F 1/20* (2006.01)
  *G06F 19/00* (2011.01)
  *F28D 15/00* (2006.01)

(52) U.S. Cl.
  USPC ...... 361/699; 361/679.53; 361/689; 361/700; 165/80.2; 165/80.4; 165/80.5; 165/104.23; 165/104.29; 165/104.33; 417/48; 417/50; 417/53

(58) Field of Classification Search
  USPC .......... 361/679.46, 679.53, 679.54, 689, 698, 361/699, 700–712; 165/80.2, 80.3, 80.4, 165/80.5, 96, 104.23, 104.24, 104.29, 165/104.33, 185; 62/259.2; 417/48, 50, 53, 417/322, 413.2, 413.3; 257/706, 713, 714, 257/718, 719; 174/15.2, 16.3, 15.1
  See application file for complete search history.

(56) References Cited

U.S. PATENT DOCUMENTS

| | | | |
|---|---|---|---|
| 3,267,860 A * | 8/1966 | Brown | 417/48 |
| 5,632,876 A | 5/1997 | Zanzucchi et al. | |
| 5,769,155 A | 6/1998 | Ohadi et al. | |
| 5,788,819 A | 8/1998 | Onishi et al. | |
| 6,149,789 A | 11/2000 | Benecke et al. | |
| 6,260,579 B1 | 7/2001 | Yokota et al. | |
| 6,374,909 B1 * | 4/2002 | Jeter et al. | 165/96 |
| 6,443,704 B1 * | 9/2002 | Darabi et al. | 417/50 |
| 6,890,409 B2 * | 5/2005 | Woudenberg et al. | 204/242 |
| 6,949,176 B2 * | 9/2005 | Vacca et al. | 204/547 |
| 7,108,056 B1 * | 9/2006 | Moghaddam et al. | 165/201 |
| 7,185,697 B2 * | 3/2007 | Goodson et al. | 165/104.33 |
| 7,497,594 B2 | 3/2009 | Nagarekawa et al. | |
| 7,929,305 B1 | 4/2011 | Pal | |
| 8,053,938 B2 | 11/2011 | Pal et al. | |
| 8,171,745 B2 | 5/2012 | Schroder | |
| 8,190,303 B2 * | 5/2012 | Lin et al. | 700/300 |
| 8,194,406 B2 * | 6/2012 | Campbell et al. | 361/698 |
| 8,308,926 B2 * | 11/2012 | Liu et al. | 204/643 |
| 2004/0112568 A1 * | 6/2004 | Liu et al. | 165/11.1 |
| 2008/0101022 A1 * | 5/2008 | Cernasov | 361/699 |

* cited by examiner

Primary Examiner — Michail V Datskovskiy
(74) Attorney, Agent, or Firm — Carlson, Gaskey & Olds, PC

(57) ABSTRACT

A cooling system has an inlet plenum and at least one cooling channel which communicates with the inlet plenum. The cooling channel passes adjacent to a component to be cooled from an upstream inlet to a downstream outlet. A pair of electrodes are positioned adjacent the inlet to create an electric field tending to resist a bubble formed in an included dielectric liquid from moving in an upstream direction due to a dielectrophoretic force. Instead, a dielectrophoretic force urges the bubble in a downstream direction.

12 Claims, 2 Drawing Sheets

DIELECTROPHORETIC RESTRICTION TO PREVENT VAPOR BACKFLOW

BACKGROUND OF THE INVENTION

This application relates to a cooling structure wherein electrodes are placed in on one end of a cooling tube, to provide a restriction preventing backflow of a vapor from a dielectric liquid moving in a non-desired direction.

The thermal management of electronics presents a large and growing challenge. High power density electronics require an increase in the heat flux generated by electronic devices, such that passive cooling may no longer be sufficient. Thermal management limitations are beginning to present a ceiling from electronics reaching full capacity.

As an example, clock speeds on central processing units have been reduced, and the power rating for power electronic components has been restricted. The theoretical operating limits of the electronic devices far exceed what is possible to implement with present cooling solutions.

Fluid pumping has been proposed, however, most mechanical pumps raise reliability issues, and can introduce noise, vibration and other challenges.

Dielectrophoretic pumping is known, and has been proposed for some applications in cooling electronics. A dielectrophoretic force is generally provided by varying an electrical response relative to a bubble which is formed in a dielectric fluid. In general, the dielectric liquid behaves in one way relative to a dielectrophoretic force, but a bubble of vapor will react in a distinct manner.

One challenge in utilizing two-phase cooling occurs when very small cooling channels are utilized. Such channels, known as microchannels, face challenges when a bubble forms within the fluid. The bubbles expand in both an upstream and downstream direction, and radially outwardly. Expansion in the upstream direction is undesirable, and may cause excessive pressure oscillations and can introduce vapor to an inlet plenum, which can in turn cause flow mal-distribution.

A physical restriction to inhibit this growth would increase the pressure drop on the channel, which is also undesirable.

SUMMARY OF THE INVENTION

A cooling system has an inlet plenum and at least one cooling channel which communicates with the inlet plenum. The cooling channel passes adjacent to a component to be cooled from an upstream inlet to a downstream outlet. A pair of electrodes are positioned adjacent the inlet to create an electric field tending to resist a bubble formed in an included dielectric liquid from moving in an upstream direction due to a dielectrophoretic force. Instead, a dielectrophoretic force urges the bubble in a downstream direction.

These and other features of this application will be best understood from the following specification and drawings, the following of which is a brief description.

DETAILED DESCRIPTION

Figure 1:
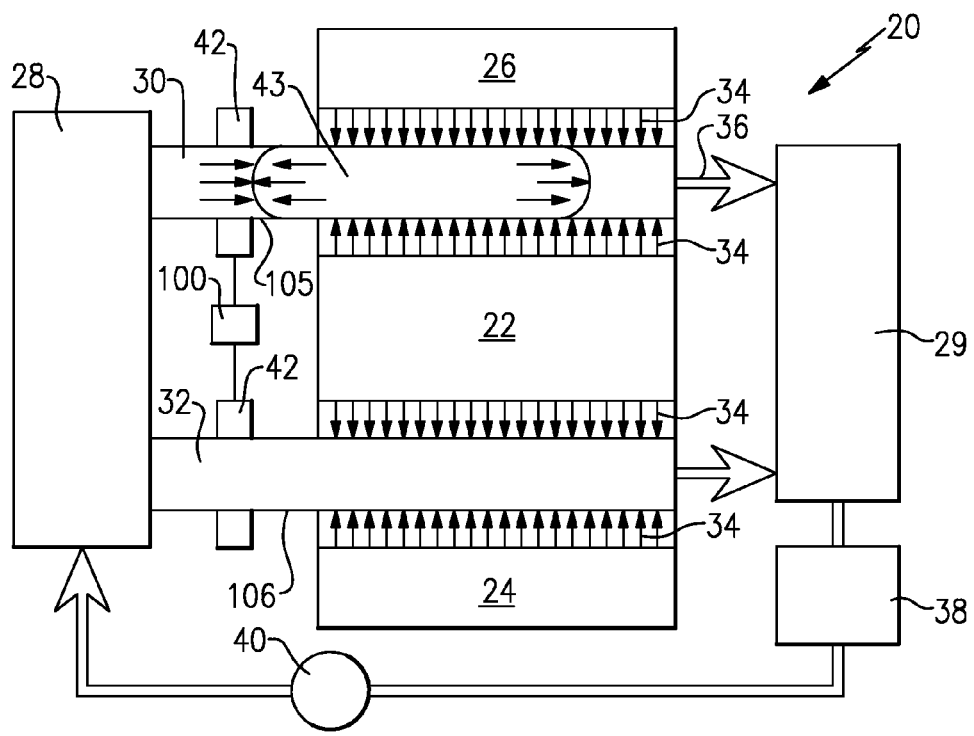
FIG. 1 schematically shows a cooling scheme.

FIG. 1 shows an electronic control stack 20. The stack includes electronic elements 22, 24 and 26, which are to be cooled. Intermediate cooling channels 30 and 32 extend between the electronic elements 22, 24 and 26, and tap heat such as shown at 34. A dielectric fluid fills the channels 30/32, and when the dielectric fluid is heated, bubbles 43 form. Thus, when the liquid cools the electronic elements 22, 24, and 26, bubbles 43 are formed.

While the cooling system is shown for cooling electronics, it may have application in non-electronic cooling applications. As an example, the system could be utilized as an evaporator for a vapor compression cycle, in which the heat source to be cooled could be ambient air. Any number of other applications would also benefit from the teachings of this application.

Electrodes 42 are positioned adjacent one side of the channels 30 and 32, and create a non-uniform electric field at inlets 105 and 106 to an area where cooling will occur. A control and current supply 100 drives the electrodes 42. This non-uniform electric field repulses the bubble 43 in a direction away from the electrode 42. Thus, the bubble 43 would tend to flow toward an outlet 36, or to the right as shown in FIG. 1. The bubble may then pass through outlet 36 to outlet plenum 29, and to a heat exchanger 38. The heat exchanger 38 may simply be an outer wall of the overall stack 20. From the heat exchanger 38, the fluid passes to a pump 40, and back to an inlet plenum 28.

When the bubble 43 is driven to the outlet (as shown in FIG. 1), additional liquid flows into channels 30 and 32, such that pumping occurs from left to right due to the dielectrophoretic force. The dielectrophoretic force thus supplements, or may replace, the pump 40.

Figure 2:
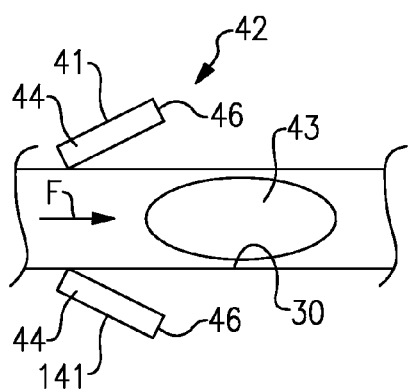
FIG. 2 shows a detail of the FIG. 1 scheme.

As shown in FIG. 2, the electrode 42 includes a pair of spaced electrode plates 41/141 each having an upstream end 44, which is spaced closer from an opposed upstream end 44 then are the downstream ends 46. This positioning creates the non-uniform electric field which will create a force F tending to force the bubble 43 to the right as shown in FIG. 2.

In essence, as the bubble grows both axially and radially, the non-uniform field provides a "force field" that the liquid will not see, but the vapor bubbles will see. This force field would cause the bubbles to expand preferentially in the downstream direction and inhibit the undesirable upstream growth beyond the location of the electrodes 42. In particular, the force field acts to prevent vapor that is expanding upstream from reaching the inlet plenum 28 When the word "move" is utilized in this application to refer to these bubbles, it should be understood that the expansion of the bubbles, or "growth" would come within the definition of "move."

Figure 3:
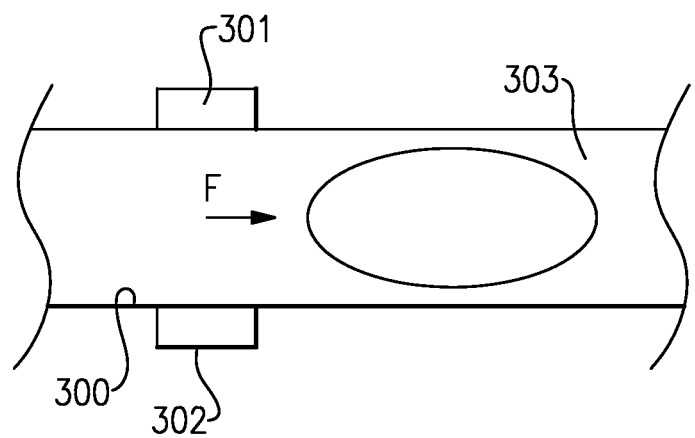
FIG. 3 shows an alternative embodiment.

FIG. 3 shows another embodiment wherein a channel 300 is provided with electrodes 301 and 302 that are parallel, rather than angled as shown in the FIG. 2 embodiment. Again, the field created by these electrodes will force F a bubble in the downstream direction relative to the downstream portions 303, which do not see the same field from the electrodes 301 and 302.

Figure 4:
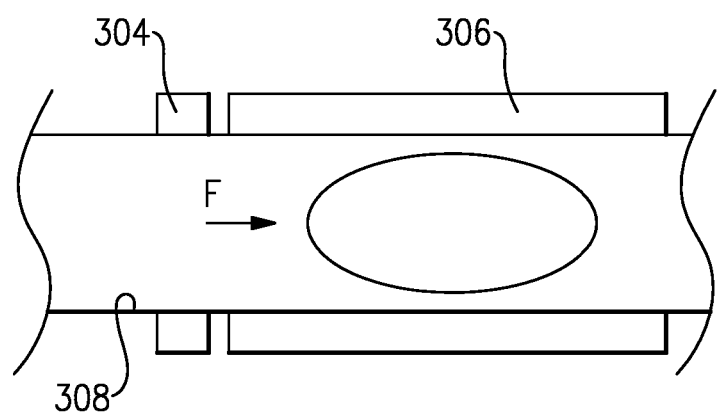
FIG. 4 shows yet another alternative embodiment.

FIG. 4 shows yet another embodiment, wherein the electrodes 304 and 306 could be ring electrodes surrounding a channel 308. Here again, a force F will force the bubble toward a downstream direction.

While the specific disclosure shows the dielectrophoretic force resisting movement of the bubble, by selectively spacing the electrodes, it may be possible to provide a force urging the bubble in the downstream direction, rather than resisting movement in the upstream direction.

Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. A dielectrophoretic cooling system comprising:
    an inlet plenum and at least one cooling channel communicating with said inlet plenum, said at least one cooling channel passing adjacent to a component to be cooled, from an upstream inlet to a downstream outlet, and a pair of electrodes positioned adjacent one of said inlet and said outlet, said electrodes being provided to create an electric field tending to urge a bubble formed in an included dielectric liquid to move in a downstream direction.

2. The system as set forth in claim 1, wherein there are a plurality of cooling channels.

3. The system as set forth in claim 1, wherein there are plural ones of said component which are cooled.

4. The system as set forth in claim 1, wherein said electrode is provided by a pair of spaced electrode plates each having upstream ends and downstream ends with a spacing between said upstream ends being different than a spacing between said downstream ends to provide the force urging the bubble in the upstream direction.

5. The system as set forth in claim 4, wherein said downstream ends are spaced farther than said upstream ends such that said electrodes resist movement of the bubble in an upstream direction.

6. The system as set forth in claim 1, wherein an outlet plenum receives the dielectric liquid downstream of said outlet, and communicates the dielectric liquid to a pump which returns the dielectric liquid to an inlet plenum, with said inlet plenum communicating the dielectric liquid to said inlet.

7. The system as set forth in claim 1, wherein said electrodes are mounted adjacent an upstream end of said at least one cooling channel, and there are no electrodes toward said downstream direction such that the field will be stronger at the upstream direction, and force the bubble in the downstream direction.

8. The system as set forth in claim 1, wherein said electrodes include at least one ring electrode surrounding said at least one cooling channel.

9. An electronic control and cooling system comprising:
    at least one electronic element;
    a pair of cooling channels associated with opposed faces of said electronic element;
    an inlet plenum and said pair of cooling channels communicating with said inlet plenum, said pair of cooling channels passing from an upstream inlet to a downstream outlet, and an electrode positioned adjacent one of said inlet and said outlet, said electrode being provided to create an electric current tending to urge a bubble formed in an included dielectric liquid to move in a downstream direction, and instead urging the bubble in a downstream direction; and
    said electrode being provided by a pair of spaced electrode plates each having upstream ends and downstream ends with a spacing between said upstream ends being different than a spacing between said downstream ends to provide the force urging the bubble in the upstream direction.

10. The system as set forth in claim 9, wherein there are plural ones of said component which are cooled.

11. The system as set forth in claim 8, wherein said downstream ends are spaced farther than said upstream ends such that said electrodes resist movement of the bubble in an upstream direction.

12. The system as set forth in claim 9, wherein an outlet plenum receives the dielectric liquid downstream of said outlet, and communicates the dielectric liquid to a pump which returns the dielectric liquid to an inlet plenum, with said inlet plenum communicating the dielectric liquid to said inlet.

* * * * *